(12) United States Patent
Zach

(10) Patent No.: US 10,386,829 B2
(45) Date of Patent: Aug. 20, 2019

(54) SYSTEMS AND METHODS FOR CONTROLLING AN ETCH PROCESS

(71) Applicant: KLA-Tencor Corporation, Milpitas, CA (US)

(72) Inventor: Franz Zach, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/266,679

(22) Filed: Sep. 15, 2016

(65) Prior Publication Data

US 2017/0084473 A1    Mar. 23, 2017

Related U.S. Application Data

(60) Provisional application No. 62/220,890, filed on Sep. 18, 2015.

(51) Int. Cl.
*H01L 21/67* (2006.01)
*G05B 19/418* (2006.01)
*H01J 37/32* (2006.01)

(52) U.S. Cl.
CPC .. *G05B 19/41885* (2013.01); *H01J 37/32091* (2013.01); *H01J 37/32174* (2013.01); *H01J 37/32926* (2013.01); *H01J 37/32935* (2013.01); *G05B 2219/32343* (2013.01); *G05B 2219/45031* (2013.01); *G05B 2219/45212* (2013.01);
(Continued)

(58) Field of Classification Search
CPC .... G05B 19/41885; G05B 2219/32343; G05B 2219/45031; G05B 2219/45212; G05B 2219/42155; Y02P 90/20; Y02P 90/26; H01J 2237/334; H01J 2237/3343; H01J 37/32091; H01J 37/32174; H01J 37/32926; H01J 37/32935
USPC ............ 156/345.24, 345.25, 345.26, 345.27, 156/345.33
See application file for complete search history.

(56) References Cited

U.S. PATENT DOCUMENTS 6,818,561 B1   11/2004   Sonderman
6,959,224 B2   10/2005   Good et al.
(Continued)

OTHER PUBLICATIONS

PCT Search Report for International Application No. PCT/US16/052273 dated Dec. 22, 2016, 3 pages.
(Continued)

*Primary Examiner* — Lan Vinh
(74) *Attorney, Agent, or Firm* — Suiter Swantz pc llo

(57) ABSTRACT

A system for controlling an etch process includes an etching tool, a metrology tool, and a controller. The etching tool is controllable via a set of control parameters and may execute a plurality of etch recipes containing values of the set of control parameters. The controller may direct the etching tool to execute a plurality of etch recipes on a plurality of metrology targets; direct the metrology tool to generate metrology data indicative of two or more etch characteristics on the plurality of metrology targets; determine one or more relationships between the two or more etch characteristics and the set of control parameters based on the metrology data; and generate, based on the one or more relationships, a particular etch recipe to constrain one of the two or more etch characteristics and maintain the remainder of the two or more etch characteristics within defined bounds.

36 Claims, 12 Drawing Sheets

(52) U.S. Cl.
CPC . *H01J 2237/334* (2013.01); *H01J 2237/3343* (2013.01); *Y02P 90/20* (2015.11); *Y02P 90/26* (2015.11)

(56) References Cited

U.S. PATENT DOCUMENTS

| | | | |
|---|---|---|---|
| 7,035,696 | B1 | 4/2006 | Sadeghi et al. |
| 7,115,211 | B2 | 10/2006 | Delp |
| 7,402,257 | B1 | 7/2008 | Sonderman et al. |
| 7,403,834 | B2 | 7/2008 | Poolla et al. |
| 7,894,927 | B2 | 2/2011 | Funk et al. |
| 7,967,995 | B2 | 6/2011 | Funk et al. |
| 8,019,458 | B2 | 9/2011 | Funk et al. |
| 8,214,771 | B2 | 7/2012 | Adel et al. |
| 8,532,796 | B2 | 9/2013 | Prager et al. |
| 8,612,045 | B2 | 12/2013 | Mos et al. |
| 8,612,902 | B1 | 12/2013 | Agarwal et al. |
| 2004/0060659 | A1* | 4/2004 | Morioka ........... H01J 37/32935 156/345.26 |
| 2004/0118516 | A1 | 6/2004 | Grasshoff et al. |
| 2005/0118812 | A1* | 6/2005 | Donohue ......... G05B 19/41875 438/689 |
| 2006/0007425 | A1 | 1/2006 | Rueger et al. |
| 2009/0132078 | A1* | 5/2009 | Sakano ............ G05B 19/41875 700/103 |
| 2013/0052757 | A1 | 2/2013 | Park et al. |
| 2015/0004721 | A1* | 1/2015 | Akimoto ........... H01J 37/32926 438/9 |

OTHER PUBLICATIONS

Yuri Karzhavin, Improving the etch process as part of an overall plan to increase fab productivity, MicroMagazine.com, http://micromagazine.fabtech.org/archive/01/05/Karzhavin.html, Printed online Sep. 16, 2015, 8 pages.

\* cited by examiner

SYSTEMS AND METHODS FOR CONTROLLING AN ETCH PROCESS

CROSS-REFERENCE TO RELATED APPLICATION

The present application claims the benefit under 35 U.S.C. § 119(e) of U.S. Provisional Application Ser. No. 62/220,890, filed Sep. 18, 2015, entitled METHOD FOR OPTIMIZING AN ETCH PROCESS WITHIN PRODUCT CONSTRAINTS, naming Franz Zach as inventor, which is incorporated herein by reference in the entirety.

TECHNICAL FIELD

The present disclosure relates generally to process control, and, more particularly, to controlling etch process.

BACKGROUND

Semiconductor device fabrication typically includes one or more etch processes, or etching steps, to selectively remove a portion of a sample. An etch process may be characterized by various etch characteristics such as, but not limited to, a critical dimension of a fabricated feature, a sidewall angle of a fabricated feature, an etch rate, or the like. In some applications, it may be beneficial to prioritize certain etch characteristics over others. In this way, a control system may seek to adjust the etch process to bring prioritized etch characteristics as close as possible to a target metric. However, in doing so, a typical control system may cause other etch characteristics to fall outside of desired tolerances. Therefore, it would be desirable to provide a system and method for curing defects such as those of the identified above.

SUMMARY

A system for controlling an etch process is disclosed, in accordance with one or more illustrative embodiments of the present disclosure. In one illustrative embodiment, the system includes an etching tool controllable via a set of control parameters. In another illustrative embodiment, the etching tool may execute a plurality of etch recipes in which an etch recipe includes values of the set of control parameters. In another illustrative embodiment, the system includes a metrology tool. In another illustrative embodiment, the system includes a controller communicatively coupled to the etching tool and the metrology tool. In another illustrative embodiment, the controller includes one or more processors to execute one or more instructions. In another illustrative embodiment, the one or more instructions cause the one or more processors to direct the etching tool to execute a plurality of etch recipes on a plurality of metrology targets. In another illustrative embodiment, the one or more instructions cause the one or more processors to direct the metrology tool to generate metrology data indicative of two or more etch characteristics on the plurality of metrology targets. In another illustrative embodiment, the one or more instructions cause the one or more processors to determine one or more relationships between the two or more etch characteristics and the set of control parameters based on the metrology data. In another illustrative embodiment, the one or more instructions cause the one or more processors to generate, based on the one or more relationships, a particular etch recipe to constrain one of the two or more etch characteristics and maintain the remainder of the two or more etch characteristics within defined bounds.

A system for controlling an etch process is disclosed in accordance with one or more illustrative embodiments of the present disclosure. In one illustrative embodiment, the system includes an etching tool controllable via a set of control parameters. In another illustrative embodiment, the etching tool may execute a plurality of etch recipes, in which an etch recipe includes values of the set of control parameters. In another illustrative embodiment, the system includes a metrology tool. In another illustrative embodiment, the system includes a controller communicatively coupled to the etching tool and the metrology tool. In another illustrative embodiment, the controller includes one or more processors to execute one or more instructions. In another illustrative embodiment, the one or more instructions cause the one or more processors to direct the etching tool to execute a plurality of etch recipes on a plurality of metrology targets. In another illustrative embodiment, the one or more instructions cause the one or more processors to direct the metrology tool to generate metrology data indicative of two or more etch characteristics on the plurality of metrology targets. In another illustrative embodiment, the one or more instructions cause the one or more processors to determine one or more relationships between the set of control parameters and the two or more etch characteristics. In another illustrative embodiment, the one or more instructions cause the one or more processors to generate an empirical process model of the etch process, wherein the empirical process model relates the set of control parameters to the two or more etch characteristics based on the metrology data. In another illustrative embodiment, the one or more instructions cause the one or more processors to generate, based on the empirical process model, a particular etch recipe to optimize one of the two or more etch characteristics and maintain the remainder of the two or more etch characteristics within defined bounds.

A method for controlling an etch process is disclosed, in accordance with one or more illustrative embodiments of the present disclosure. In one illustrative embodiment, the method includes directing an etching tool to execute a plurality of etch recipes on a plurality of metrology targets. In another illustrative embodiment, the etching tool may be controllable via a set of control parameters. In another illustrative embodiment, the etching tool may execute a plurality of etch recipes, in which an etch recipe includes values of the set of control parameters. In another illustrative embodiment, the method includes directing a metrology tool to generate metrology data indicative of two or more etch characteristics on the plurality of metrology targets. In another illustrative embodiment, the method includes determining one or more relationships between the two or more etch characteristics and the set of control parameters based on the metrology data. In another illustrative embodiment, the method includes generating, based on the one or more relationships, a particular etch recipe to constrain one of the two or more etch characteristics and maintain the remainder of the two or more etch characteristics within defined bounds.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
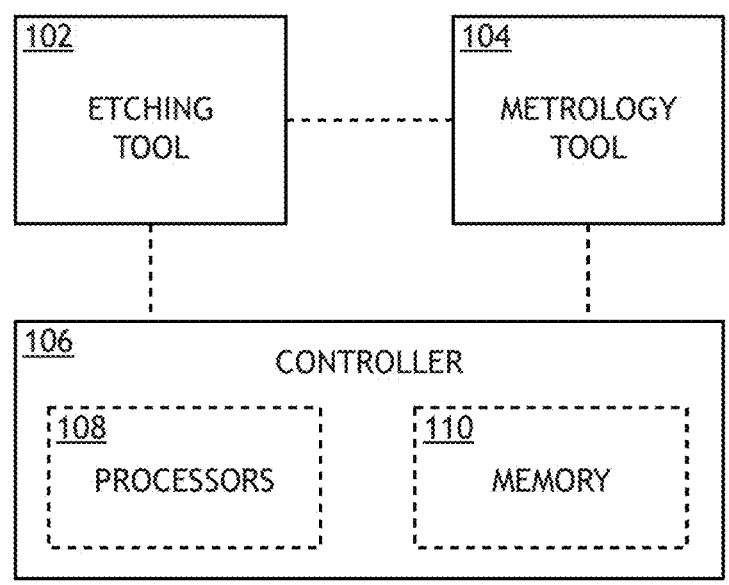
FIG. 1 is a conceptual view of a system for controlling an etch process, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Referring generally to FIGS. 1 through 12B, a system 100 and a method 300 for controlling an etch process are described, in accordance with one or more embodiments of the present disclosure.

Semiconductor device fabrication typically includes one or more etch processes, or etching steps, to selectively remove a portion of a sample. An etch process may typically follow, but is not required to follow, a lithography step in which a pattern mask is generated on the sample to define a pattern to be etched. In this regard, a pattern mask may have one or more physical properties that differ from those of the sample such that the pattern mask and the sample etch at different rates. For example, a pattern mask may be highly resistant to an etch process such that the exposed portions of the sample may be removed by the etch process and the portions of the sample covered by the pattern mask may be largely unaffected. By way of another example, a pattern mask may be less resistant to an etch process than surrounding material such that the pattern mask may be removed by the etch step. Further, pre-existing features on the sample (e.g., layers of materials, physical structures, or the like) may further affect the rate at which exposed portions of the sample are removed.

Multiple control parameters (i.e. etch actuators) may be available to dictate the physical conditions of the etch process. In this way, modifications of the control parameters may impact physical properties of the resulting etch profile (i.e., etch characteristics) such as, but not limited to, physical characteristics of resultant structures on a sample (e.g. a critical dimension of a feature associated with removed material, a sidewall angle between etched and unetched material, or the like), the uniformity of these physical characteristics across the sample, or etch selectivity characteristics.

It may be the case that controlling an etch process within specified tolerances requires accounting for interactions between control parameters and etch characteristics. For example, modifying a single control parameter (e.g. the sample temperature) may impact multiple etch characteristics (e.g. sidewall angle, etch selectivity, or the like). Accordingly, manipulating control parameters to control a first etch characteristic may, in turn, impact additional etch characteristics.

Design constraints on a particular etch process may require tighter tolerances on one or more etch characteristics (e.g. primary etch characteristics) than others (e.g. secondary etch characteristics). In this regard, a system for controlling the etch process may seek to tightly constrain, or optimize, these primary etch characteristics to fall within regulated bounds. It is noted that the terms "optimization,"

"optimize," "maximize," "minimize" and the like are used within the present disclosure to signify manipulation of control parameters of an etch process to drive an etch characteristic at or near a target value within design tolerances. Further, optimization need not require achieving a single "best" value. Rather, optimization may provide a relative value signifying performance within certain constraints. Additionally, optimization may include prioritizing certain etch characteristics over others such that prioritized characteristics may be driven to be closer to target values than unprioritized characteristics.

However, it may also be the case that design requirements include constraints (e.g. bounds) on one or more secondary etch characteristics. In this regard, the primary etch characteristics may be optimized (e.g. directed towards a target value) to the extent that the secondary etch characteristics remain within the determined bounds. It is noted that without constraints on secondary etch characteristics, a control system may optimize primary etch characteristics to the detriment of the secondary etch characteristics such that the resulting semiconductor device may fail. Embodiments of the present disclosure are directed to systems and methods for controlling one or more primary etch characteristics of an etch process while maintaining one or more secondary etch characteristics within defined bounds.

As used throughout the present disclosure, the term "sample" generally refers to a substrate formed of a semiconductor or non-semiconductor material (e.g. a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1 is a conceptual view of a system 100 for controlling an etch process, in accordance with one or more embodiments of the present disclosure. In one embodiment, the system 100 includes an etching tool 102. The etching tool 102 may include one or more components to perform an etch process. It is recognized herein that the etching tool 102 may include any etching tool known in the art. For example, the etching tool 102 may include, but is not limited to, components to perform plasma etching. In this regard, the etching tool 102 may include components to generate a plasma from a gas species (e.g. provided by a gas source) such that the plasma initiates one or more chemical reactions to remove a portion of the sample. In one instance, the plasma may be generated via a radio-frequency (RF) electromagnetic field to excite species of the gas source to a plasma state. Further, the excited gas species may include charged particles (e.g. ions), or neutral particles.

In a general sense, the etching tool 102 may include components to perform any type of etching processes such as, but not limited to, a dry etch process or a wet etch process. In some embodiments, the etching tool 102 may perform multiple types of etching processes simultaneously or in sequence.

In one embodiment, the etching tool 102 may be controllable by one or more control parameters (e.g. etch actuators). In this regard, manipulation of the control parameters may modify the etch process and, in turn, etch characteristics of the sample. In another embodiment, the system 100 includes a metrology tool 104 to characterize one or more aspects of a sample. For example, the metrology tool 104 may characterize the sample after the etching tool 102 performs an etch process. In this regard, the metrology tool 104 may monitor one or more etch characteristics associated with the etch process. Further, the metrology tool 104 may characterize the sample before, after, or at any number of intermediate times during the etching process.

The metrology tool 104 may include any type of metrology tool known in the art. For example, the metrology tool 104 may measure any metrology metric (e.g. overlay error, critical dimension, sidewall angle, or the like) using any method known in the art. In one embodiment, the metrology tool 104 includes an image-based metrology tool to measure metrology data based on the generation of one or more images of the sample. In another embodiment, the metrology tool 104 includes a scatterometry-based metrology system to measure metrology data based on the scattering (e.g., reflection, diffraction, diffuse scattering, or the like) of light from the sample.

In another embodiment, the system 100 includes a controller 106. In one embodiment, the controller 106 is communicatively coupled to the etching tool 102 and/or the metrology tool 104. The controller 106 may be coupled to the etching tool 102 and/or the metrology tool 104 in any suitable manner (e.g., by one or more transmission media indicated by the line shown in FIG. 1). In this regard, the controller 106 may manipulate control parameters of the etching tool 102 to provide control over the etch process. Further, the controller 106 may receive data from the metrology tool 104 indicative of the etch characteristics. Accordingly, the controller 106 may utilize feedback from the metrology tool 104 to manipulate control parameters of the etching tool 102 and thus control the etch process.

In one embodiment, the controller 106 includes one or more processors 108. In another embodiment, the one or more processors 108 are configured to execute a set of program instructions maintained in a memory medium 110, or a memory. The embodiments of the system 100 illustrated in FIG. 1 may be further configured as described herein. In addition, the system 100 may be configured to perform any other step(s) of any of the method embodiment(s) described herein.

It is recognized herein that the quality of an etch process may be defined by a set of etch characteristics that may be directly or indirectly measured by the metrology tool 104. In this regard, the etch characteristics may be associated with one or more metrology metrics. Further, multiple control parameters (e.g. etch actuators) may be available to control the etch characteristics for a particular etch process. Control parameters may be associated with settings of components of the etching tool 102 that affect the etch process.

Figure 2:
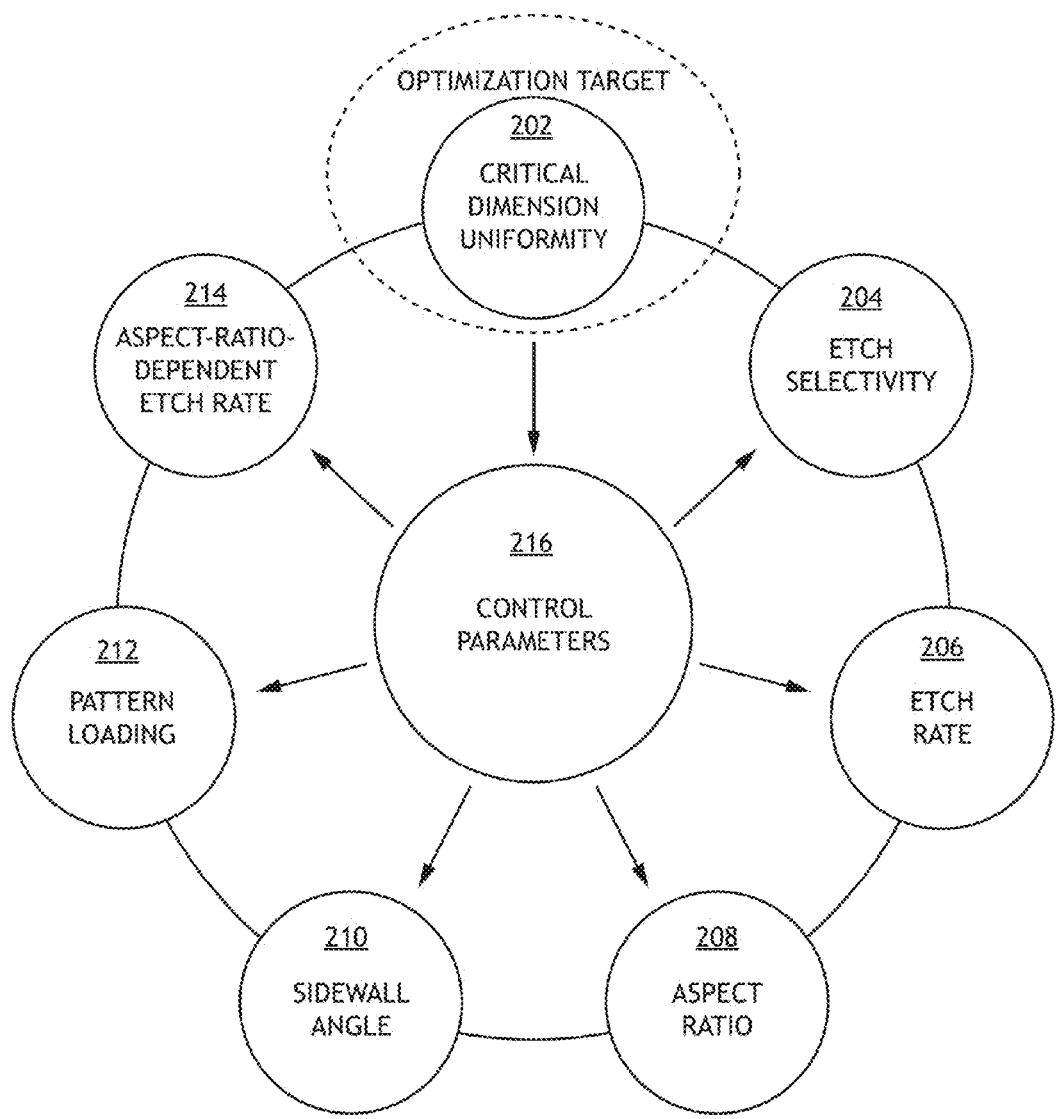
FIG. 2 is a conceptual diagram illustrating the relationship between control parameters and etch characteristics of an etch process, in accordance with one or more embodiments of the present disclosure.

FIG. 2 is a conceptual diagram illustrating the relationship between control parameters and etch characteristics of an etch process, in accordance with one or more embodiments of the present disclosure. In one embodiment, the quality of an etch process is defined by etch characteristics 202-214. For example, etch characteristics may include an across-sample critical dimension uniformity 202. In this regard, an etch process may be characterized by the uniformity of a critical dimension across the sample. A critical dimension may be any dimension associated with a feature generated by the removal of material in an etch process such as, but not limited to, the width of a trench of removed material at a specified depth.

By way of another example, etch characteristics may include the etch selectivity 204 and/or sample etch rate 206. The sample etch rate 206 may include the rate at which material is removed from the sample under particular etch conditions. The etch selectivity 204 may include a difference between the sample etch rate 206 and the etch rate of a pattern mask. Further, the etch selectivity 204 may be, but is not required to be, expressed as a ratio of the sample etch rate 206 and the etch rate of the photomask.

By way of another example, etch characteristics may include an aspect ratio 208 and/or a sidewall angle 210 of a feature generated by the removal of material in the etch process. It is noted that the removal of material via etching is a complex process involving chemical reactions at the surface of exposed material and the diffusion of removed material from the surface to reveal a new surface layer. Accordingly, the shape of a trench of removed material may differ depending on the etch process. A sidewall angle 210 may define an angle of a wall between removed material and unetched material. In some cases, a sidewall angle may be vertical (e.g. 90°) such that material of the sample located beneath the pattern mask remains unetched for the entire etch depth. In this regard, a negative pattern of the photoresist (e.g. corresponding to exposed sections of the sample) may be uniformly etched into the sample. In some, cases, however, the sidewall angle may be more than 90°. This may occur, for example, in cases where a material removal rate decreases with depth such that a width of a trench narrows with increasing depth. In other cases, a sidewall angle may be less than 90°, indicating the removal of material from beneath the pattern mask. Additionally, the aspect ratio 208 may define a length to width ratio of surface dimensions of a feature (e.g. a trench of removed material, a bar of unetched material, or the like). By way of another example, etch characteristics may include pattern loading effects 212 and/or an aspect-ratio-dependent etch rate 214, or ARDE. For example, etch rates may vary based on one or more aspects of the pattern (e.g. as defined by the pattern mask) such as, but not limited to, the aspect ratio of the structures and the density of pattern features due to differences in the availability of etchant materials on the surface, transport rates of material from trenches, or the like.

It is noted herein that etch characteristics 202-214 are provided solely for illustrative purposes and should not be interpreted as limiting the present disclosure. For example, an etch process may be defined by any number of etch characteristics measurable directly or indirectly by a metrology tool 104.

In another embodiment, etch characteristics 202-214 may be interrelated, as depicted by connecting lines in FIG. 2. For example, physical processes associated with etching (e.g. availability of etchant species, surface area of the sample available for etching, transport of etched material away from the surface, or the like) may simultaneously impact multiple etch characteristics. By way of illustration, the aspect ratio of a pattern to be etched may impact the aspect ratio 208 of resultant structures, the sidewall angle 210 of the resultant structures, and the aspect-ratio-dependent etch rate 214 associated with the etch process. Additionally, control parameters 216 of an etch process may simultaneously affect any number of etch characteristics.

It may be the case that design and/or performance requirements dictate that one or more etch characteristics (e.g. primary etch characteristics) be constrained. For example, one or more primary etch characteristics may substantially impact the quality of the resulting features, the ability to perform subsequent patterning steps, or the ultimate performance of a fabricated semiconductor device. In one instance, as illustrated in FIG. 2, the critical dimension uniformity 202 may be the target of optimization (e.g. a primary etch characteristic). In this regard, the controller 106 may manipulate control parameters 216 of the etch process to decrease a variance of a critical dimension across the sample. As noted above, the controller 106 may generate a set of control parameters that provides a critical dimension uniformity 202 that lies within a specified tolerance range.

However, it may also be the case that design requirements include constraints (e.g. bounds) on one or more secondary etch characteristics. In this regard, the primary etch characteristics may be optimized to the extent possible based on the limits of the secondary etch characteristics (e.g. via constrained optimization, or the like). In some cases, without constraints on secondary etch characteristics, a system may optimize primary etch characteristics to the detriment of others such that the resulting device may fail.

It is noted herein that the classification of primary etch characteristics and secondary etch characteristics may be carried out according to any method known in the art. In one embodiment, the classification of primary etch characteristics (e.g. which etch characteristics are to be optimized) and/or secondary etch characteristics is determined by a user (e.g. via a user input device, or the like). In another embodiment, the classification of primary etch characteristics and/or secondary etch characteristics may be determined by the controller 106 (e.g. based on feedback from the metrology tool 104, an external system, or the like).

It is noted that maintaining secondary etch characteristics within defined bounds may modify an optimal value of primary etch characteristics due to relationships between control parameters and etch characteristics. Continuing the example above, design specifications may dictate that a control system for an etch process optimize the critical dimension uniformity 202 while maintaining sidewall angle 210 within a certain tolerance range. In this regard, the control system may manipulate the control parameters of the etch process to maximize critical dimension uniformity 202 to the extent possible while maintaining the sidewall angle 210 within the defined bounds. It is noted that a requirement to maintain secondary etch characteristics (e.g. sidewall angle 210) within a tolerance range may result in more variation in primary etch characteristics (e.g. critical dimension uniformity 202) than might be possible without this requirement. However, by constraining the secondary etch characteristics, the overall performance of the etch process, and thus the resulting semiconductor device, may be improved. In a general sense, any number of etch characteristics may be secondary etch characteristics such that any number of etch characteristics may be maintained with defined bounds during an etch process.

Figure 3:
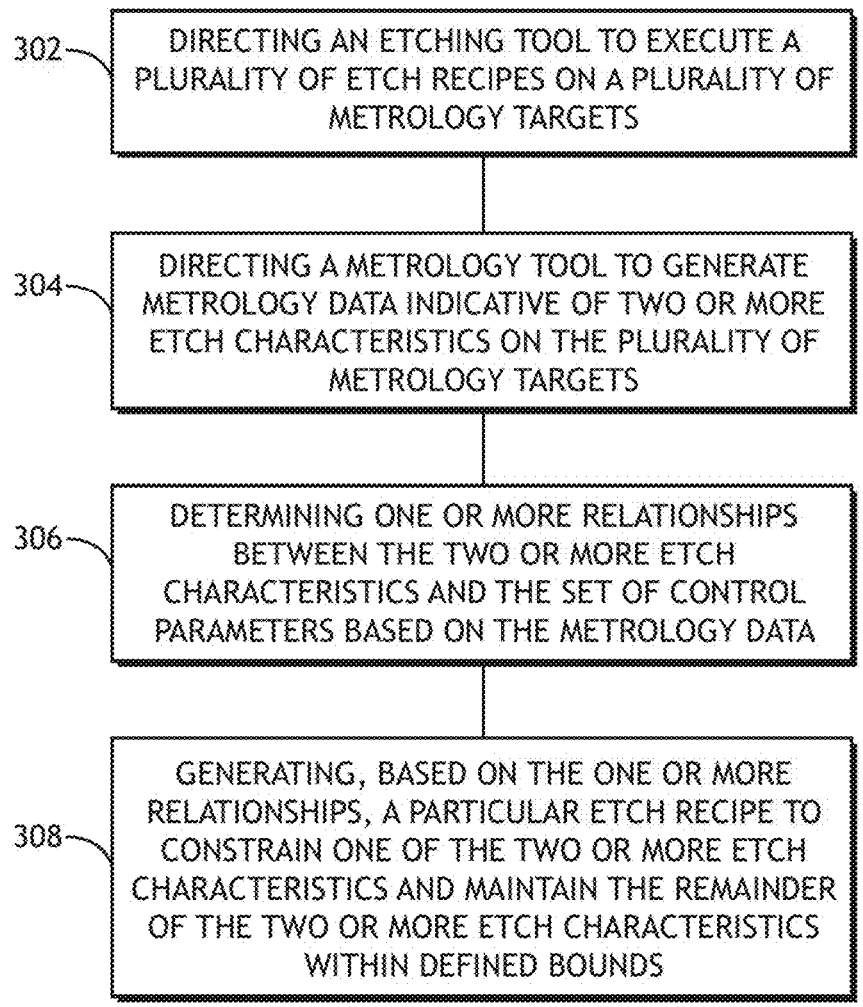
FIG. 3 is a flow diagram illustrating steps performed in a method of optimizing an etch process based on optimization of one or more etch characteristics, in accordance with one or more embodiments of the present disclosure.

FIG. 3 is a flow diagram illustrating steps performed in a method 300 of optimizing an etch process based on optimization of one or more etch characteristics (e.g. one or more primary etch characteristics), in accordance with one or more embodiments of the present disclosure. It is noted herein that the steps of method 300 may be implemented all or in part by the system 100. It is further recognized, however, that the method 300 is not limited to the system 100 in that additional or alternative system-level embodiments may carry out all or part of the steps of method 300.

In one embodiment, the method 300 includes a step 302 of directing an etching tool 102 to execute a plurality of etch recipes on a plurality of metrology targets. A particular etch recipe may include a particular set of values of control parameters of the etching tool 102 used to carry out a particular iteration of an etch process.

In another embodiment, the method 300 includes a step 304 of directing a metrology tool 104 to generate metrology data indicative of two or more etch characteristics (e.g. primary etch characteristics and secondary etch characteristics) on the plurality of metrology targets, in accordance with one or more embodiments of the present disclosure.

As previously noted, etch characteristics (e.g. etch characteristics 202-214) of an etch process may depend on the particular values of the control parameters (e.g. the etch recipe). Further, conditions generated by a particular etch recipe may impact more than one etch characteristic. In one embodiment, step 302 includes generating a set of metrology targets in which metrology data associated with each metrology target is indicative of one or more etch characteristics. In this regard, the impact of an etch recipe on each etch characteristic (e.g. primary and secondary etch characteristics) may be quantifiable.

Figure 4:
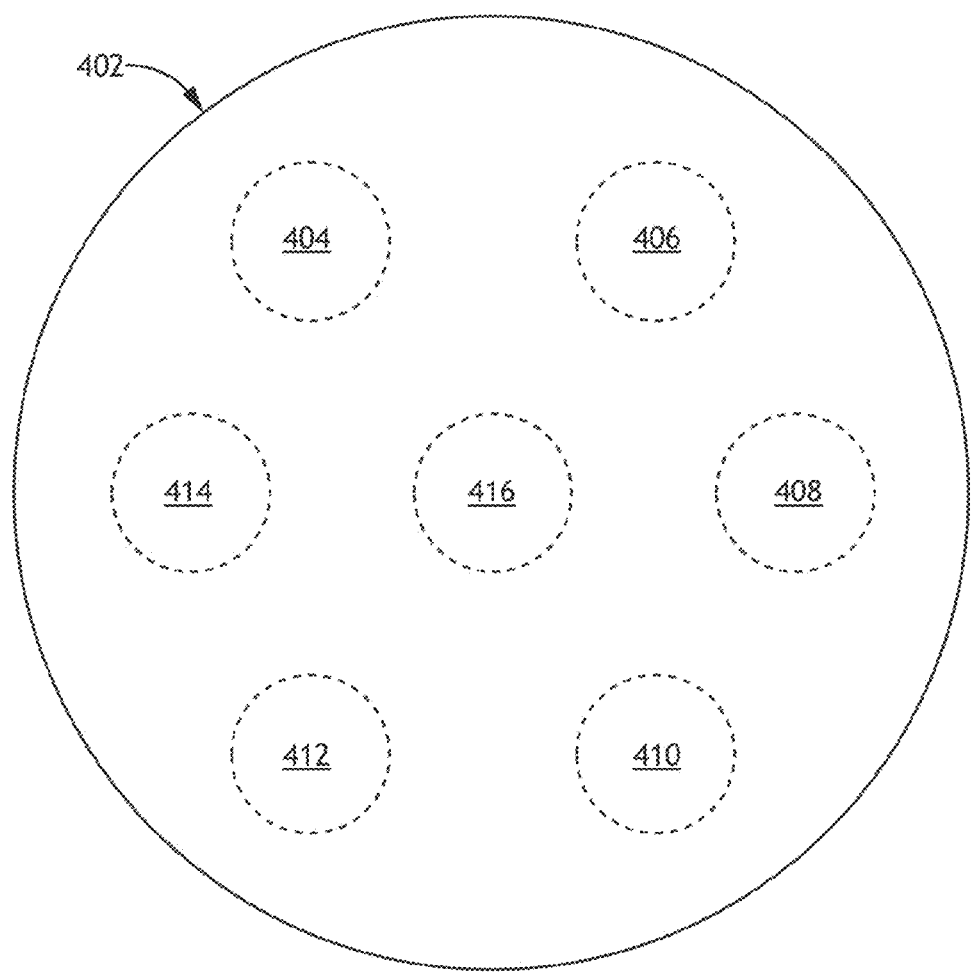
FIG. 4 is a conceptual view of a test sample including a set of metrology targets, in accordance with one or more embodiments of the present disclosure.

FIG. 4 is a conceptual view of a test sample including a set of metrology targets, in accordance with one or more embodiments of the present disclosure. In one embodiment, a test sample 402 includes metrology targets 404-416. In another embodiment, each of metrology targets includes features suitable for monitoring a particular etch characteristic. For example, a first metrology target may be designed to provide metrology data indicative of a first etch characteristic (e.g. aspect-ratio-dependent etch rate 214, or the like), a second metrology target may be designed to provide metrology date indicative of a second etch characteristic (e.g. etch selectivity 204, or the like), and so on.

In another embodiment, step 302 includes directing the etching tool 102 to execute a plurality of etch recipes on multiple instances of a test sample (e.g. test sample 402). For example, step 302 may include directing the etching tool 102 to execute a first etch recipe on a first instance of test sample 402, a second etch recipe on a second instance of test sample 402, and so on. In this regard, the impacts of variations of control parameters on specific etch characteristics may be quantifiable.

In another embodiment, though not shown, a test sample 402 may include multiple spatially-dispersed instances of each metrology target (e.g. metrology targets 404-416). In this regard, variations of the etch characteristics across a sample may be characterized. For example, a metrology target may be designed to provide metrology data on a critical dimension. Accordingly, multiple spatially-dispersed instances of this metrology target may provide data indicative of the critical dimension uniformity 202.

FIGS. 5 through 9B provide views of illustrative examples of metrology targets suitable for providing data indicative of particular etch characteristics.

Figure 5:
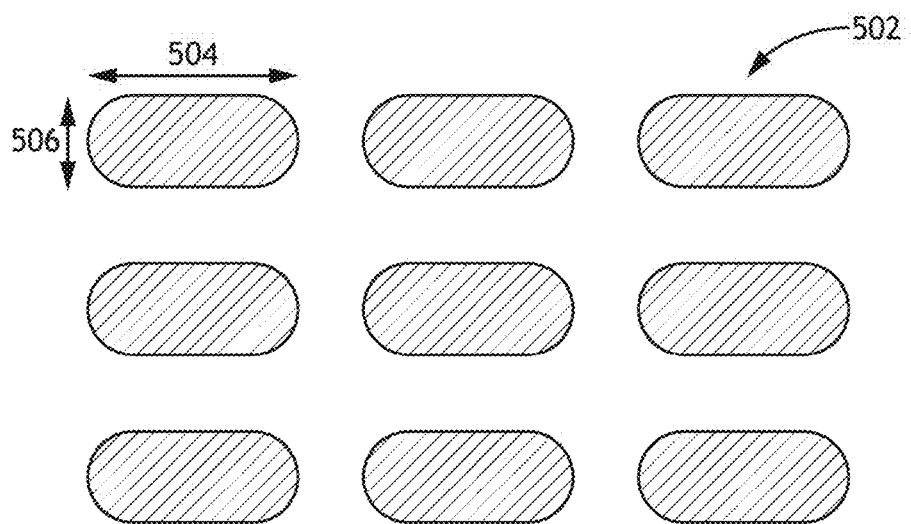
FIG. 5 is a top view of a metrology target pattern designed to provide data indicative of variations in the aspect ratio of etched structures, in accordance with one or more embodiments of the present disclosure.

FIG. 5 is a top view of a metrology target pattern 500 designed to provide data indicative of variations in the aspect ratio 208 of etched structures, in accordance with one or more embodiments of the present disclosure. In one embodiment, metrology target pattern 500 includes a set of trench patterns 502 having a length 504 and a width 506. In this regard, the trench patterns 502 represent exposed areas of the sample (e.g. not covered with an etch-resistant pattern mask) to be etched by the etch process. In another embodiment, step 304 includes measuring the aspect ratios of fabricated trenches associated with trench patterns 502. In this regard, data indicative of the aspect ratio 208 of fabricated structures may be determined for a plurality of etch recipes. It is noted that the fabricated structures may not have the same length and width as the trench patterns 502 (e.g. length 504 and width 506) and that the actual dimensions of the fabricated structures may vary depending on the etch recipe. In another embodiment, step 304 may include acquiring one or more statistics (e.g. mean, variance, or the like) of the measured aspect ratios based on the set of trench patterns 502.

In another embodiment, though not shown, metrology target pattern 500 includes multiple sets of trench patterns of varying aspect ratios. For example, aspect ratios of trench patterns in the metrology target 500 may have any aspect ratio including, but are not limited to, a value within a range from 1:1 to 20:1. In this regard, a metrology target pattern 500 may include a first set of trench patterns with a first aspect ratio, a second set of trench patterns with a second aspect ratio, and so on. Accordingly, step 304 may provide additional metrology data based on specific values of the aspect ratios of trench patterns. For example, a particular etch recipe may be suitable for fabricating low aspect ratio structures, but may not be suitable for fabricating high-aspect ratio structures.

Figure 6:
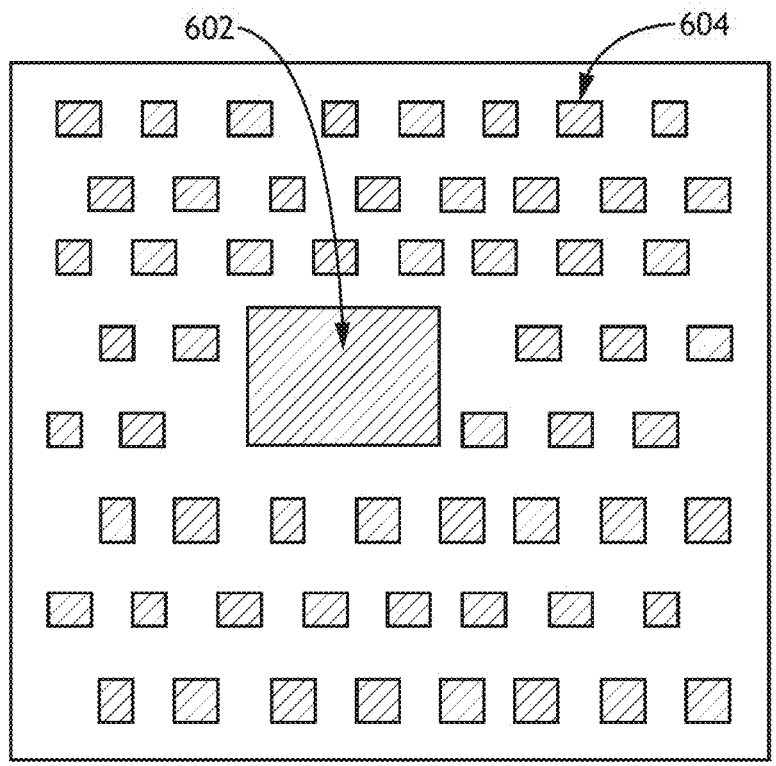
FIG. 6 is a top view of a metrology target pattern designed to provide data indicative of pattern loading effects, in accordance with one or more embodiments of the present disclosure.

FIG. 6 is a top view of a metrology target pattern 600 designed to provide data indicative of pattern loading effects 212, in accordance with one or more embodiments of the present disclosure. For example, the density of pattern structures and/or the surface area of exposed material (e.g. sample material not covered by an etch-resistant pattern mask) may impact the depletion of reactive etchant species. For example, a pattern including a large amount of exposed material may lead to localized depletions of the reactive etchant species that, in turn, may lead to localized variations of the etch rate (e.g. macro-loading effects). In one embodiment, the metrology target pattern 600 includes a primary pattern 602 surrounded with an array (e.g. an ordered array or a random array) of additional patterns 604. In this regard, the patterns 602,604 are exposed to the reactive etchant species. Further, step 304 may include data indicative of etching characteristics of the primary pattern 602 (e.g. sample etch rate 206, aspect ratio 208, etch selectivity 204, sidewall angle 210, or the like) based on the presence of the additional patterns 604. The additional patterns 604 may have any shape or distribution. In one embodiment, the additional patterns 604 have uniform dimensions that are different than that of the primary pattern 602. In another embodiment, the additional patterns 604 have varying sizes. In another embodiment, a metrology target pattern 600 includes a set of primary patterns 602 each surrounded by a different density of additional patterns 604 to provide additional metrology data based on specific values of the density of the additional patterns 604.

Figure 7A:
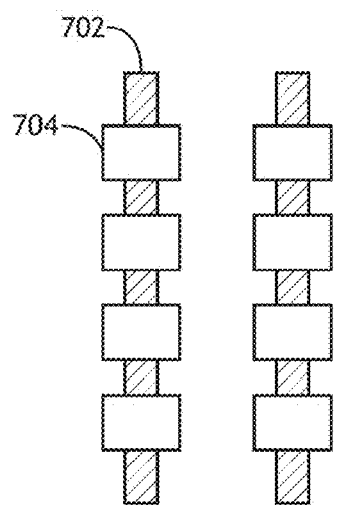
FIG. 7A is a top view of a metrology target pattern designed to provide data indicative of the sidewall angle of a via, in accordance with one or more embodiments of the present disclosure.
Figure 7B:
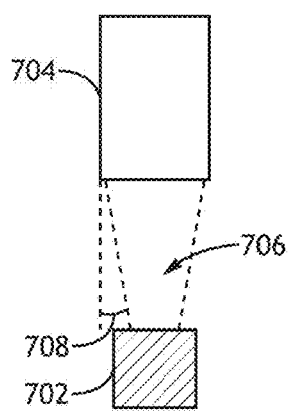
FIG. 7B is a profile view of an etch profile of a via associated with the metrology target pattern of FIG. 7A, in accordance with one or more embodiments of the present disclosure.

FIG. 7A is a top view of a metrology target pattern 700 designed to provide data indicative of the sidewall angle of a via, in accordance with one or more embodiments of the present disclosure. For example, metrology target pattern 700 may include a multi-layer structure having a lower layer having metal features 702 and an upper layer having openings 704. In this regard, an etch process may generate a via through the openings 704 to the metal features 702 below. FIG. 7B is a profile view of an etch profile of a via 706 associated with the metrology target pattern of FIG. 7A, in accordance with one or more embodiments of the present disclosure. In one embodiment, step 304 may include generating metrology data indicative of the sidewall angle 708 of the via (e.g. the via chamfer). It is noted that the sidewall angle 708 may depend on the size and/or aspect ratio of the opening 704 as well as the particular etch recipe. In another embodiment, a metrology target pattern includes openings 704 of varying size to generate additional data associated with the size of the openings 704.

Figure 8A:
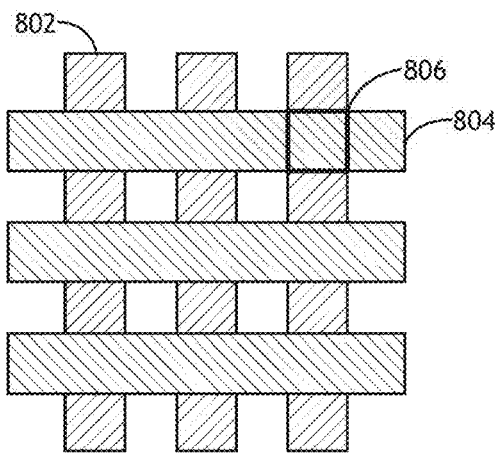
FIG. 8A is a top view of a metrology target pattern designed to provide data indicative of etch selectivity, in accordance with one or more embodiments of the present disclosure.
Figure 8B:
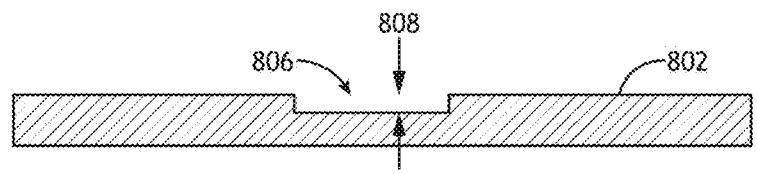
FIG. 8B is a profile view of the etch profile associated with the metrology target pattern of FIG. 8A, in accordance with one or more embodiments of the present disclosure.

FIG. 8A is a top view of a metrology target pattern 800 designed to provide data indicative of etch selectivity 204, in accordance with one or more embodiments of the present disclosure. For example, the metrology target pattern 800 may include a first pattern 802 oriented in a first direction and a second pattern 804 oriented in a second direction. Further, the first pattern 802 may be etched via a first etch step using a first pattern mask and the second pattern 804 may be etched via a second etch step using a second pattern mask. FIG. 8B is a profile view of the etch profile associated with the metrology target pattern of FIG. 8A, in accordance with one or more embodiments of the present disclosure. In one embodiment, the first etch step is designed to remove hardmask material patterned onto the sample. Further, in order to achieve complete removal of the hardmask material, the etch process may be designed to continue to etch a portion of material beneath the hardmask at a reduced etch rate determined by the etch selectivity 204. In this regard, the hardmask may be fully removed in a portion 806 of the metrology target 800 prior to the second etch step such that the second etch step continues to etch the material exposed by the first step. As a result, a difference between the etch depth 808 of the double-exposed portion 806 of the metrology target 800 and the surrounding material may correspond to the etch selectivity 204. In one embodiment, step 304 may include generating metrology data indicative of the relative etch depths of multiple portions of the metrology target pattern 800 indicative of etch selectivity 204.

Figure 9A:
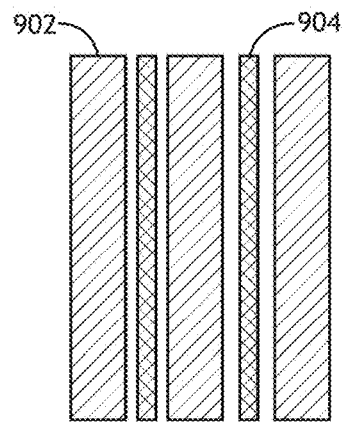
FIG. 9A is a top view of a metrology target pattern designed to provide data indicative of topography effects, in accordance with one or more embodiments of the present disclosure.
Figure 9B:
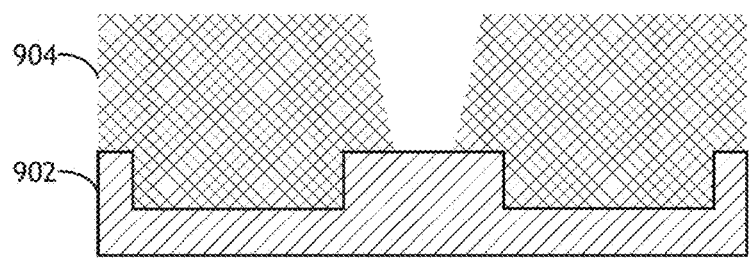
FIG. 9B is a profile of the etch profile associated with the metrology target pattern of FIG. 9A, in accordance with one or more embodiments of the present disclosure.

FIG. 9A is a top view of a metrology target pattern 900 designed to provide data indicative of topography effects, in accordance with one or more embodiments of the present disclosure. In one embodiment, metrology target pattern 900 includes a first pattern 902 generated in a first patterning step (e.g. a first lithography step and a subsequent etch process step) and a second pattern 904 generated in a second patterning step (e.g. a second lithography step and a subsequent etch process step). It is noted that, in a multi-step fabrication process, the removal of a first pattern mask (e.g. a hardmask) may impact the coating behavior of subsequent processing steps. FIG. 9B is a profile view of the etch profile associated with the metrology target pattern of FIG. 9A, in accordance with one or more embodiments of the present disclosure. In this regard, the topography (e.g. thickness) of fabricated features associated with the second pattern 904 is influenced by the topography of fabricated features associated with the first pattern 902. For example, as illustrated in FIG. 9B, a volume of fabricated trenches in the first pattern 902 may influence the amount of material required to fabricate the second pattern to a desired height in the location of the via. Accordingly, relatively less material may be needed to fill in narrow features in pattern 902 than wide trenches in pattern 902. In another embodiment, step 304 includes generating metrology data associated with variations of the thickness of fabricated features associated with the second pattern 904 based on the topography of fabricated features associated with the first pattern 902.

In another embodiment, metrology targets designed to provide data indicative of the aspect-ratio-dependent etch rate 214 and/or micro-loading effects include a set of patterns with varying linewidths and spacing. For example, Table 1 includes a series of pattern elements having fixed pitch and varying linewidths, in accordance with one or more embodiments of the present disclosure. In this regard, a metrology target may include patterns associated with each row of Table 1. Accordingly, step 304 may include measurements of the etch rates of each of the patterns described in Table 1.

TABLE 1

Line and space dimensions of a fixed-pitch metrology target for the measurement of the aspect-ratio-dependent etch rate 214

| Linewidth (a.u.) | Space (a.u.) | Pitch (a.u.) |
| --- | --- | --- |
| 24 | 216 | 240 |
| 30 | 210 | 240 |
| 40 | 200 | 240 |
| 50 | 190 | 240 |
| 70 | 170 | 240 |
| 100 | 140 | 240 |
| 140 | 100 | 240 |
| 168 | 72 | 240 |

In another embodiment, a metrology target designed to provide data indicative of the aspect-ratio-dependent etch rate 214 and/or micro-loading effects may include a set of patterns with a fixed linewidth and varying spacing such that the global density is varied.

In another embodiment, the method 300 includes a step 306 of determining one or more relationships between the two or more etch characteristics and the set of control parameters based on the metrology data. In this regard, metrology data collected in step 304 may be indicative of relationships between the multiple etch characteristics and the sets of control parameters in the etch recipes executed in step 302. Accordingly, step 306 may include the generation of an empirical model (e.g. a behavioral model, or the like) to describe variations of etch characteristics in response to manipulation of the control parameters.

In another embodiment, nonlinear behaviors of etch processes may be described by a multi-order model based on the simultaneous manipulation of two or more control parameters. The following paragraphs provide an illustrative example of a controlled design of experiments to determine second-order relationships between exemplary control parameters and exemplary etch processes, in accordance with one or more embodiments of the present disclosure.

Continuing the example above, an etching tool 102 may include a plasma etching system. In this regard, the etching tool 102 may include, but is not limited to, a chamber, a gas injection system to supply gas species to the chamber, a plasma generation system (e.g. one or more electrodes, a radio-frequency power source, or the like), and a mount to secure a sample. Accordingly, control parameters associated with the etching tool 102 may include, but are not required to include, a composition of gas species used to generate a plasma, the RF power of the plasma generation system to control the characteristics of a generated plasma (e.g. the energies of ions in the generated plasma, or the like), a gas flow rate of the gas injection system, a pressure in the chamber, a temperature within the chamber, a temperature of the sample, or an etch time.

Further, one or more components of the etching tool 102 may provide independent control parameters for multiple zones within the chamber. In this regard, values of control parameters may be varied across the multiple zones to facilitate the control of the uniformity of etch characteristics across the sample. For example, the etching tool 102 may include a multi-zone gas injection system. Accordingly, control parameters may include the composition and/or the flow rate of gas from each of the multiple zones. By way of another example, the etching tool 102 may include transformer-coupled-capacitive-tuning circuitry to dynamically tune the power distribution of the plasma generation source. In this regard, control parameters may include, but are not limited to, an RF frequency or current of one or more electrodes (e.g. coils, or the like) to control the spatial distribution of ion density on the sample. By way of another example, the etching tool 102 may include a multi-zone sample temperature controller to independently control the temperature of multiple zones of the sample. In this regard, control parameters may include the temperature of individual zones of the multi-zone sample temperature controller. In one embodiment, a multi-zone sample temperature controller includes a two-dimensional array of cells (e.g. a ten by ten array, or the like) with individually-controllable temperature. For example, the cells of the multi-zone sample temperature controller may be actuated to generate a radial temperature distribution on the sample to provide uniform etch characteristics (e.g. etch rate, sidewall angle of etched structures, or the like).

In one embodiment, step 302 of method 300 may include generating a set of etch recipes to develop second-order relationships between three control parameters: a first zone (T1) of a multi-zone sample temperature controller, a second zone (T2) of a multi-zone sample temperature controller, and a center-to-edge gas flow ratio (GFR) of a two-zone gas injection system. In this illustrative example, each control parameter may be adjusted to one of three levels. For example, the first zone of the multi-zone sample temperature controller may be adjusted to any of levels T1_A, T1_B, or T1_C, representing different temperature settings of the first zone. Similarly, the second zone of the multi-zone sample temperature controller may be adjusted to any of levels T2_A, T2_B, or T2_C, representing different temperature settings of the second zone. Further, the center-to-edge gas flow ratio may be adjusted to any of levels GFR_A, GFR_B, or GFR_C, representing different gas flow ratios between a center zone and an edge zone. Accordingly, a set of etch recipes associated with step 302 may be described by Table 2

TABLE 2

Exemplary etch recipes

| Run | Etch Recipe | | |
|---|---|---|---|
| | T1 | T2 | GFR |
| 1 | T1_B | T2_A | GFR_B |
| 2 | T1_C | T2_A | GFR_A |
| 3 | T1_C | T2_C | GFR_C |
| 4 | T1_A | T2_C | GFR_A |
| 5 | T1_A | T2_A | GFR_C |
| 6 | T1_A | T2_A | GFR_A |
| 7 | T1_C | T2_C | GFR_A |
| 8 | TA_C | T2_A | GFR_C |
| 9 | TA_C | T2_B | GFR_B |
| 10 | T1_A | T2_B | GFR_A |
| 11 | T1_A | T2_C | GFR_C |
| 12 | T1_A | T2_C | GFR_B |
| 13 | T1_B | T2_B | GFR_C |

TABLE 2-continued

Exemplary etch recipes

| Run | Etch Recipe | | |
|---|---|---|---|
| | T1 | T2 | GFR |
| 14 | T1_A | T2_B | GFR_C |
| 15 | T1_B | T2_C | GFR_A |
| 16 | T1_A | T2_A | GFR_B |

In this regard, the etch recipes of Table 2 allow for the development of first order impacts of each of the control parameters as well as second order interactions of combinations of the control parameters. For example, interactions may include, but are not limited to, T1*T2, T1*GFR, T2*GFR, T1*T1, T2*T2, or GFR*GFR.

It is to be understood that the example provided above is provided solely for illustrative purposes and should not be interpreted as limiting the present disclosure. The generation of a set of etch recipes suitable for characterizing relationships between control parameters and etch characteristics may include any number of control parameters having any number of possible levels. Further, the etching tool 102 may include any components suitable for any type of etch process such as, but not limited to, a dry etch process or a wet etch process.

In another embodiment, the method 300 includes a step 308 of generating, based on the relationships between the control parameters and the etch characteristics determined in step 306, a particular etch recipe to constrain one of the two or more etch characteristics and maintain the remainder of the etch characteristics within defined bounds. For example, step 308 may include generating a particular etch recipe that optimizes one etch characteristic (e.g. a primary etch characteristic) while maintaining one or more additional etch characteristics (e.g. secondary etch characteristics) within defined bounds. For example, as illustrated in FIG. 2, it may be desirable to maximize (e.g. bring at or above a target value) the critical dimension uniformity 202 while providing boundaries or tolerances for one or more additional etch characteristics. Accordingly, utilizing relationships between various control parameters and etch characteristics developed in step 306, step 308 may include the generation of values for a particular set of control parameters (e.g. a particular etch recipe) to achieve a high degree of critical dimension uniformity 202 and achieve secondary etch characteristics within desired bounds.

It is noted that any steps of method 300 may be executed using any techniques known in the art. For example, any steps of method 300 may be executed in full or in part using one or more software programs such as, but not limited to, JMP offered by SAS, MATLAB, or the like.

The following paragraphs provide an illustrative example of the optimization of the critical dimension uniformity 202, while imposing a constraint that the sidewall angle 210 must lie in the range of 80 to 85 degrees. In one embodiment, an etching tool 102 includes a plasma etching system with a two-zone gas injection system and a four-zone sample temperature controller (e.g. oriented as concentric circular zones). For example, control parameters may include temperature settings for each of the four zones of the sample temperature controller and center-to-edge gas flow ratio of a central zone and an edge zone of the gas injection system.

As described previously herein, the relationships between control parameters and etch characteristics may be determined according to the steps 302-306 of method 300.

Figure 10:
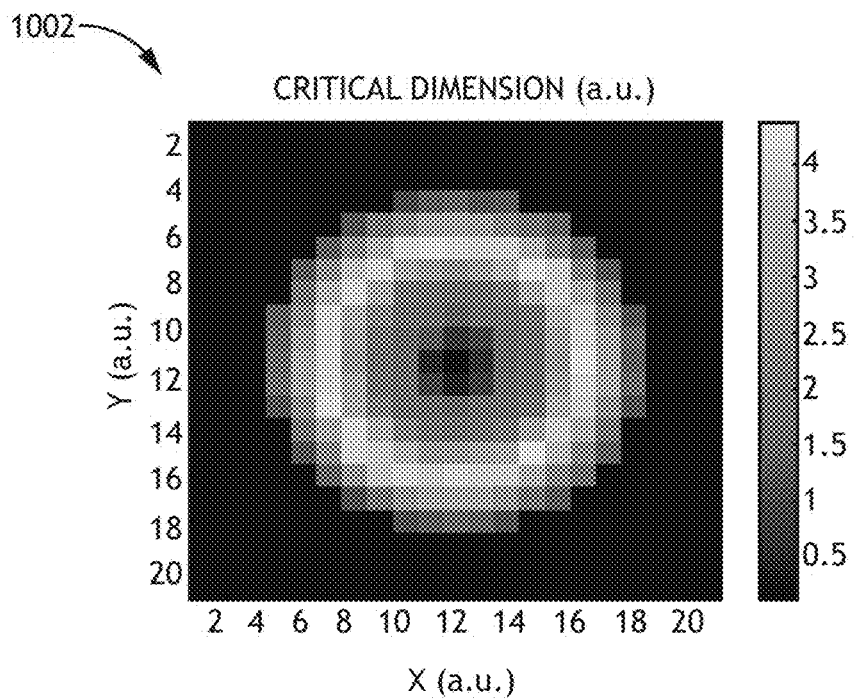
FIG. 10 is a plot of a distribution of critical dimension across a sample associated with an etch process, in accordance with one or more embodiments of the present disclosure.

FIG. 10 is a plot 1002 of an unoptimized distribution of critical dimension across a sample associated with an etch process, in accordance with one or more embodiments of the present disclosure. As seen in FIG. 10, the value of the critical dimension may vary significantly across the sample.

Figure 11A:
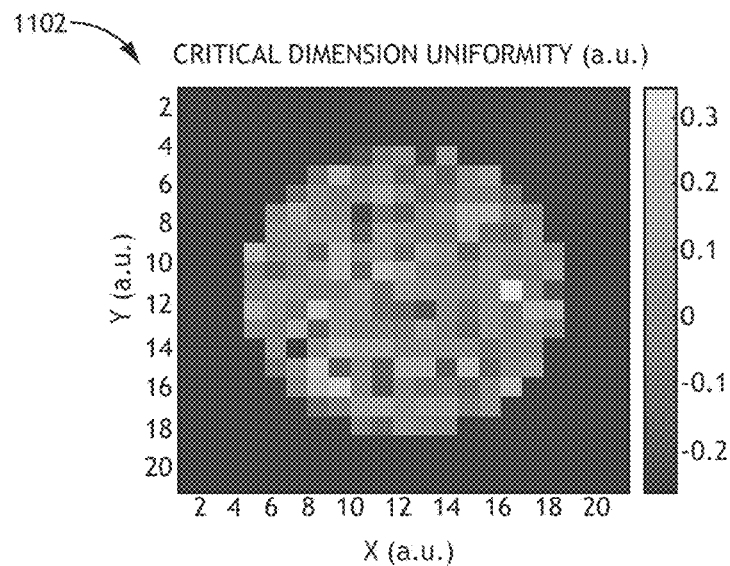
FIG. 11A is a plot illustrating critical dimension uniformity of a sample based on constraining the critical dimension uniformity alone, in accordance with one or more embodiments of the present disclosure.

FIG. 11A is a plot 1102 of the critical dimension uniformity 202 of a sample based on constraining the critical dimension uniformity 202, in accordance with one or more embodiments of the present disclosure. In one embodiment, plot 1102 is a residual associated with a difference between the critical dimension across the wafer and the 3-sigma value (e.g. three times the standard deviation of the values of the critical dimension as measured at various locations across the sample).

In one embodiment, the unconstrained optimization of the critical dimension uniformity 202 provides an etch recipe including values of (−3.0, 0.01, −2.99, 0.01) for the four zones of the sample temperature controller and a value of 2.99 for the value of the center-to-edge gas flow ratio. In this regard, the control parameters were chosen to maximize (e.g. increase to meet or exceed a target value, or the like) the critical dimension uniformity 202 without regard to the sidewall angle 210 of fabricated features. As illustrated in FIG. 11A, the critical dimension uniformity 202 has a peak value of 0.3.

Figure 11B:
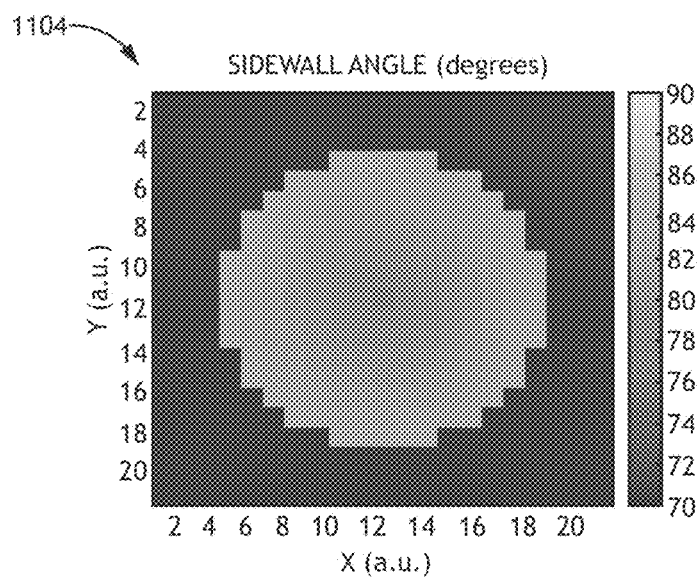
FIG. 11B is a plot of the distribution of the sidewall angle across the sample based on constraining the critical dimension uniformity alone, in accordance with one or more embodiments of the present disclosure.

FIG. 11B is a plot 1104 of the distribution of the sidewall angle 210 across the sample based on constraining the critical dimension uniformity 202, in accordance with one or more embodiments of the present disclosure. As illustrated in FIG. 11B, the sidewall angle 210 drops outside of the desired range to below 80° in a central region of the sample.

Figure 12A:
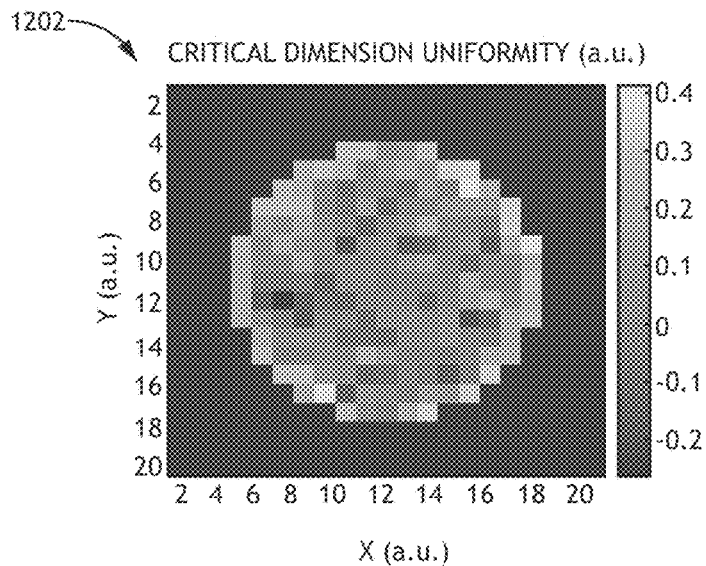
FIG. 12A is a plot 1202 of the critical dimension uniformity of a sample based on constraining the critical dimension uniformity and maintaining the sidewall angle within defined bounds, in accordance with one or more embodiments of the present disclosure.
Figure 12B:
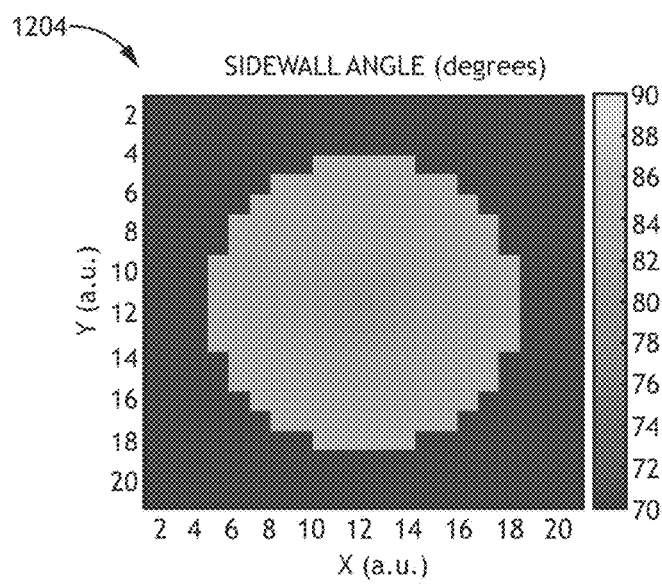
FIG. 12B is a plot of the distribution of the sidewall angle across the sample based on constraining the critical dimension uniformity and maintaining the sidewall angle within defined bounds, in accordance with one or more embodiments of the present disclosure.

FIG. 12A is a plot 1202 of the critical dimension uniformity 202 of a sample based on constraining the critical dimension uniformity 202 and maintaining the sidewall angle 210 within the defined bounds, in accordance with one or more embodiments of the present disclosure. In one embodiment, plot 1202 is a residual associated with a difference between the critical dimension across the wafer and the 3-sigma value. FIG. 12B is a plot 1204 of the sidewall angle 210 of a sample based on constraining the critical dimension uniformity 202 and maintaining the sidewall angle 210 within the defined bounds, in accordance with one or more embodiments of the present disclosure. In one embodiment, the constrained optimization of the critical dimension uniformity 202 given the bounds of the sidewall angle 210 provides an etch recipe including values of (−1.8, 0.8, 3.4, 0.33) for the four zones of the sample temperature controller and a value of 1.67 for the value of the center-to-edge gas flow ratio. As illustrated in FIG. 12B, the sidewall angle 210 is maintained above 80° at all points on the sample. Further, the critical dimension uniformity 202 has a peak value of 0.29, as illustrated in FIG. 12A.

In this regard, the value of the critical dimension uniformity 202 is slightly lower for the case of constrained optimization relative to the case of unconstrained optimization (e.g., 0.29 versus 0.3). However, constraining the optimization to maintain secondary etch characteristics (e.g. sidewall angle 210 in this illustrative example) may improve the overall quality of the etch process.

It is to be understood that the example provided above is provided solely for illustrative purposes and should not be interpreted as limiting the present disclosure. The optimization of any number of etch parameters (e.g., primary etch parameters) while maintaining any number of additional etch parameters (e.g., secondary etch parameters) within defined bounds is within the spirit and scope of the present disclosure. Further, the etching tool 102 may include any components suitable for any type of etch process such as, but not limited to, a dry etch process or a wet etch process.

Referring again to FIG. 1, the one or more processors 108 of controller 106 may include any processing element known in the art. In this sense, the one or more processors 108 may include any microprocessor-type device configured to execute software algorithms and/or instructions. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 110. Moreover, different subsystems of the system 100 (e.g., etching tool 102, metrology tool 104, a display or user interface, or the like) may include processor or logic elements suitable for carrying out at least a portion of the steps described throughout the present disclosure. Therefore, the above description should not be interpreted as a limitation on the present invention but merely an illustration.

The memory medium 110 may include any storage medium known in the art suitable for storing program instructions executable by the associated one or more processors 108. For example, the memory medium 110 may include a non-transitory memory medium. For instance, the memory medium 110 may include, but is not limited to, a read-only memory, a random access memory, a magnetic or optical memory device (e.g., disk), a magnetic tape, a solid state drive and the like. In another embodiment, it is noted herein that the memory medium 110 is configured to store one or more results from the system 100 and/or the output of one or more of the various steps described herein. It is further noted that memory medium 110 may be housed in a common controller housing with the one or more processors 108. In an alternative embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like).

In another embodiment, the controller 106 of the system 100 may be configured to receive and/or acquire data or information from other systems (e.g., inspection results from an inspection system or metrology results from a metrology system) by a transmission medium that may include wireline and/or wireless portions. In this manner, the transmission medium may serve as a data link between the controller 106 and other sub-systems of the system 100. Moreover, the controller 106 may send data to external systems via a transmission medium (e.g., network connection).

In another embodiment, the system 100 includes a user interface (not shown). In one embodiment, the user interface is communicatively coupled to the one or more processors 108 of controller 106. In another embodiment, the user interface device may be utilized by controller 106 to accept selections and/or instructions from a user. In some embodiments, described further herein, a display may be used to display data to a user. In turn, a user may input selections and/or instructions responsive to data displayed (e.g., inspection images) to the user via the display device.

The user interface device may include any user interface known in the art. For example, the user interface may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel mounted input device or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention.

The display device may include any display device known in the art. In one embodiment, the display device may include, but is not limited to, a liquid crystal display (LCD). In another embodiment, the display device may include, but is not limited to, an organic light-emitting diode (OLED) based display. In another embodiment, the display device may include, but is not limited to, a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user interface device (e.g., touchscreen, bezel mounted interface, keyboard, mouse, trackpad, and the like) is suitable for implementation in the present invention.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for controlling an etch process, comprising:
an etching tool, the etching tool controllable via a set of control parameters, the etching tool configured to execute a plurality of etch recipes, wherein an etch recipe of the plurality of etch recipes includes values of the set of control parameters;
a metrology tool; and
a controller communicatively coupled to the etching tool and the metrology tool, the controller including one or more processors, wherein the one or more processors are configured to execute one or more instructions configured to cause the one or more processors to:
direct the etching tool to execute a plurality of etch recipes on a plurality of metrology targets;
direct the metrology tool to generate metrology data indicative of two or more etch characteristics on the plurality of metrology targets;
determine one or more relationships between the two or more etch characteristics and the set of control parameters based on the metrology data; and generate, based on the one or more relationships, a particular etch recipe to constrain one of the two or more etch characteristics and maintain the remainder of the two or more etch characteristics within defined bounds.

2. The system for controlling an etch process of claim 1, wherein the set of control parameters includes an etching time.

3. The system for controlling an etch process of claim 1, wherein the etching tool includes a chamber.

4. The system for controlling an etch process of claim 3, wherein the set of control parameters includes a pressure of a gas within the chamber.

5. The system for controlling an etch process of claim 3, wherein the set of control parameters includes a composition of a gas within the chamber.

6. The system for controlling an etch process of claim 1, wherein the etching tool includes a plasma source.

7. The system for controlling an etch process of claim 6, wherein the plasma source includes a transformer-coupled plasma source.

8. The system for controlling an etch process of claim 7, wherein the set of control parameters includes a value of a radio-frequency current to drive the transformer-coupled plasma source.

9. The system for controlling an etch process of claim 7, wherein the set of control parameters includes a transformer-coupled-capacitive-tuning parameter of the transformer-coupled plasma source.

10. The system for controlling an etch process of claim 1, wherein the etching tool includes a multi-zone gas distribution assembly.

11. The system for controlling an etch process of claim 10, wherein the set of control parameters includes a number of zones of the multi-zone gas distribution assembly.

12. The system for controlling an etch process of claim 10, wherein the set of control parameters includes a gas flow rate of one or more zones of the multi-zone gas distribution assembly.

13. The system for controlling an etch process of claim 10, wherein the set of control parameters includes a composition of a gas from one or more zones of the multi-zone gas distribution assembly.

14. The system for controlling an etch process of claim 1, wherein the etching tool includes a sample temperature controller to secure a sample, wherein the sample temperature controller includes one or more zones with independently-controllable temperature.

15. The system for controlling an etch process of claim 14, wherein the set of control parameters includes a temperature of one or more of the one or more zones of the sample temperature controller.

16. The system for controlling an etch process of claim 1, wherein the two or more etch characteristics include at least one of a critical dimension uniformity, a sidewall angle, an aspect ratio, an etch rate, an etch selectivity, an aspect-ratio-dependent etch rate, or a pattern loading characteristic.

17. The system for controlling an etch process of claim 1, wherein the metrology tool comprises:
at least one of an image-based metrology system or a scatterometry-based metrology system.

18. The system for controlling an etch process of claim 1, wherein the defined bounds of the remainder of the two or more etch characteristics are determined by a user.

19. A system for controlling an etch process, comprising:
an etching tool, the etching tool controllable via a set of control parameters, the etching tool configured to execute a plurality of etch recipes, wherein an etch recipe of the plurality of etch recipes includes values of the set of control parameters;
a metrology tool; and
a controller communicatively coupled to the etching tool and the metrology tool, the controller including one or more processors, wherein the one or more processors are configured to execute one or more instructions configured to cause the one or more processors to:
direct the etching tool to execute a plurality of etch recipes on a plurality of metrology targets;
direct the metrology tool to generate metrology data indicative of two or more etch characteristics on the plurality of metrology targets;
determine one or more relationships between the set of control parameters and the two or more etch characteristics;
generate an empirical process model of the etch process, wherein the empirical process model relates the set of control parameters to the two or more etch characteristics based on the metrology data; and
generate, based on the empirical process model, a particular etch recipe to optimize one of the two or more etch characteristics and maintain the remainder of the two or more etch characteristics within defined bounds.

20. The system for controlling an etch process of claim 19, wherein the set of control parameters includes an etching time.

21. The system for controlling an etch process of claim 19, wherein the etching tool includes a chamber.

22. The system for controlling an etch process of claim 21, wherein the set of control parameters includes a pressure of a gas within the chamber.

23. The system for controlling an etch process of claim 21, wherein the set of control parameters includes a composition of a gas within the chamber.

24. The system for controlling an etch process of claim 19, wherein the etching tool includes a plasma source.

25. The system for controlling an etch process of claim 24, wherein the plasma source includes a transformer-coupled plasma source.

26. The system for controlling an etch process of claim 25, wherein the set of control parameters includes a value of a radio-frequency current to drive the transformer-coupled plasma source.

27. The system for controlling an etch process of claim 25, wherein the set of control parameters includes a transformer-coupled-capacitive-tuning parameter of the transformer-coupled plasma source.

28. The system for controlling an etch process of claim 19, wherein the etching tool includes a multi-zone gas distribution assembly.

29. The system for controlling an etch process of claim 28, wherein the set of control parameters includes a number of zones of the multi-zone gas distribution assembly.

30. The system for controlling an etch process of claim 28, wherein the set of control parameters includes a gas flow rate of one or more zones of the multi-zone gas distribution assembly.

31. The system for controlling an etch process of claim 28, wherein the set of control parameters includes a composition of a gas from one or more zones of the multi-zone gas distribution assembly.

32. The system for controlling an etch process of claim 19, wherein the etching tool includes a sample temperature controller to secure a sample, wherein the sample temperature controller includes one or more zones with independently-controllable temperature.

33. The system for controlling an etch process of claim 32, wherein the set of control parameters includes a temperature of one or more of the one or more zones of the sample temperature controller.

34. The system for controlling an etch process of claim 19, wherein the two or more etch characteristics include at least one of a critical dimension uniformity, a sidewall angle, an aspect ratio, an etch rate, an etch selectivity, an aspect-ratio-dependent etch rate, or a pattern loading characteristic.

35. The system for controlling an etch process of claim 19, wherein the metrology tool comprises:
    at least one of an image-based metrology system or a scatterometry-based metrology system.

36. The system for controlling an etch process of claim 19, wherein the defined bounds of the remainder of the two or more etch characteristics are determined by a user.

\* \* \* \* \*